US008861213B2

(12) United States Patent
Sisler (10) Patent No.: US 8,861,213 B2
(45) Date of Patent: Oct. 14, 2014

(54) CIRCUIT CARD AND CAGE ARRANGEMENT WITH IMPROVED COOLING

(75) Inventor: John Robert Sisler, Scotts Valley, CA (US)

(73) Assignee: Violin Memory, Inc., Mountain View, CA (US)

( * ) Notice: Subject to any disclaimer, the term of this patent is extended or adjusted under 35 U.S.C. 154(b) by 12 days.

(21) Appl. No.: 13/538,737

(22) Filed: Jun. 29, 2012

(65) Prior Publication Data
US 2014/0003008 A1   Jan. 2, 2014

(51) Int. Cl.
H05K 5/00 (2006.01)
H05K 7/20 (2006.01)
H05K 7/14 (2006.01)

(52) U.S. Cl.
CPC .............. *H05K 7/20* (2013.01); *H05K 7/20127* (2013.01); *H05K 7/1461* (2013.01)
USPC .......................................... 361/756; 361/731

(58) Field of Classification Search
CPC ......... H05K 7/1461; H05K 7/14; H05K 7/20; H05K 7/2039; H05K 7/20436
USPC .................. 361/756, 725, 727, 731, 576, 796
See application file for complete search history.

(56) References Cited

U.S. PATENT DOCUMENTS

| | | | | | |
|---|---|---|---|---|---|
| 4,672,509 | A | * | 6/1987 | Speraw | 361/679.49 |
| 5,617,296 | A | * | 4/1997 | Melville et al. | 361/736 |
| 6,025,991 | A | * | 2/2000 | Saito | 361/704 |
| 6,411,517 | B1 | * | 6/2002 | Babin | 361/759 |
| 6,442,035 | B1 | * | 8/2002 | Perry et al. | 361/756 |
| 6,831,842 | B1 | * | 12/2004 | Mendoza et al. | 361/796 |
| 6,894,220 | B1 | * | 5/2005 | Kozak et al. | 174/51 |
| 6,940,727 | B2 | * | 9/2005 | Dobbs et al. | 361/756 |
| 7,477,528 | B2 | * | 1/2009 | Kim | 361/825 |
| 7,679,933 | B2 | * | 3/2010 | Makabe | 361/801 |
| 2011/0205712 | A1 | * | 8/2011 | Colongo et al. | 361/728 |
| 2013/0003327 | A1 | * | 1/2013 | Saito et al. | 361/756 |

* cited by examiner

*Primary Examiner* — Lisa Lea Edmonds
*Assistant Examiner* — Keith Depew
(74) *Attorney, Agent, or Firm* — Brinks Gilson & Lione (57) ABSTRACT

A circuit card for a data processing system includes a printed circuit board (PCB) and a carrier. The PCB includes opposing sides parallel to a mounting direction when the PCB is installed to a cage. The carrier is attached to the PCB and includes at least one guiding member offset from a normal direction of the PCB and guiding installation of the PCB in the cage. The cage includes a plurality of support plates extending along a first direction and aligned along a second direction perpendicular to the first direction of the cage to define a plurality of air flow channels. When the circuit card is mounted to one of the support plates by engaging the guiding member to the support plate, the PCB is offset from the support plate and located right in the air flow channel without being obstructed by the support plate.

18 Claims, 15 Drawing Sheets

CIRCUIT CARD AND CAGE ARRANGEMENT WITH IMPROVED COOLING

FIELD

The present disclosure relates to data processing systems and more specifically to circuit card and cage arrangements with improved cooling for the data processing systems.

BACKGROUND

The statements in this section merely provide background information related to the present disclosure and may not constitute prior art.

Data processing systems generally include a plurality of printed circuit boards housed in a box-shaped cage. The cage includes a plurality of card guides defining slots into which the printed circuit boards are inserted. It is known to arrange the plurality of card guides in an array such that the printed circuit boards can be installed side by side to improve packaging efficiency. This arrangement, however, reduces available space for airflow that is used to cool the heat-generating components on the printed circuit boards.

Other aspects of the typical cage design also adversely affect the cooling of the printed circuit boards. The typical cage design includes card guides having pairs of flanges to clamp the printed circuit boards. The card guides must be made wider than the thickness of the printed circuit boards such that the printed circuit boards can be slid in the slots between the flanges. The cooling air flows across the card guides first before it flows across the printed circuit boards. Since the card guides are wider than the thickness of the printed circuit boards, the card guides prevent the cooling air from flowing close to the surfaces of the printed circuit boards for efficient cooling. Without sufficient cooling, the printed circuit boards are susceptible to heat failure.

SUMMARY

The present disclosure provides a circuit card and cage assembly for data processing system with less obstruction to air flow and with improved cooling efficiency. In one form of the present disclosure, a circuit card includes a printed circuit board (PCB) and a carrier. The PCB defines a normal direction and includes opposing sides parallel to a mounting direction when the PCB is installed to a cage. The carrier is attached to the PCB and includes at least one guiding member offset from the PCB in the normal direction. The guiding member guides installation of the PCB in the cage.

In another form of the present disclosure, a circuit card includes a printed circuit board (PCB), a plate body, and a pair of mounting structures. The PCB has opposing sides parallel to a mounting direction when the PCB is installed to a cage. The plate body is disposed adjacent to a surface of the PCB to cover a portion of the PCB. The pair of mounting structures are disposed between the PCB and the plate body for connecting the PCB to the plate body. The mounting structures each include a rail portion spaced from the plate body to define a slot between the rail portion and the plate body. The slot is parallel to the mounting direction and offset from the PCB.

In still another form of the present disclosure, a circuit card and cage assembly includes a cage and a plurality of circuit cards. The cage includes a plurality of support plates extending along a first direction of the cage. The plurality of support plates are aligned along a second direction of the cage to define a plurality of air flow channels between the plurality of support plates. The second direction is perpendicular to the first direction. The plurality of circuit cards each include a printed circuit board (PCB) and a carrier attached to the PCB and offset from the PCB along a normal direction of the PCB. The plurality of circuit cards are mounted to the support plates by engaging the carriers to the support plates such that the PCBs are offset from the support plates along the second direction.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
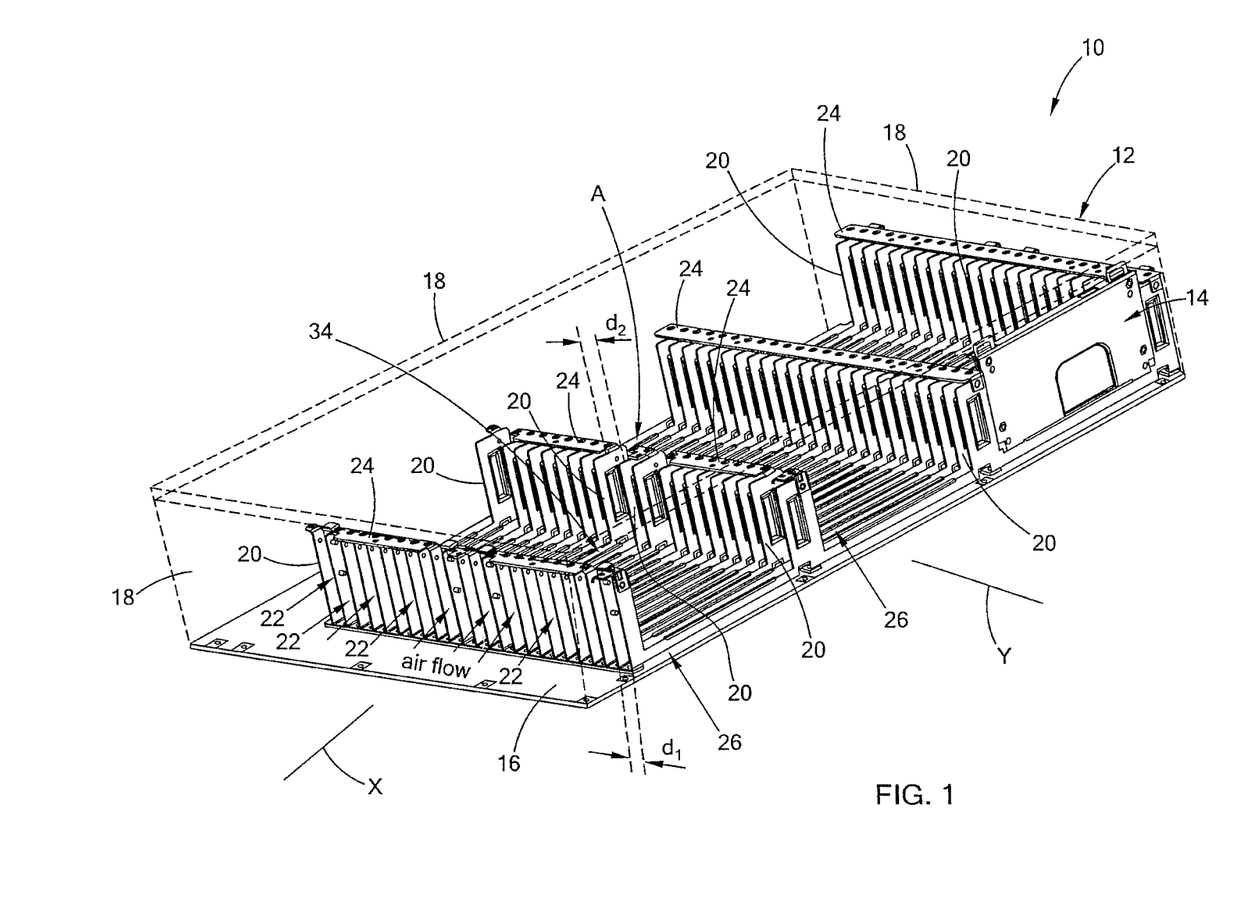
FIG. 1 is a perspective view of a circuit card and cage assembly constructed in accordance with the teachings of the present disclosure, wherein only one circuit card is shown for clarity.
Figure 2:
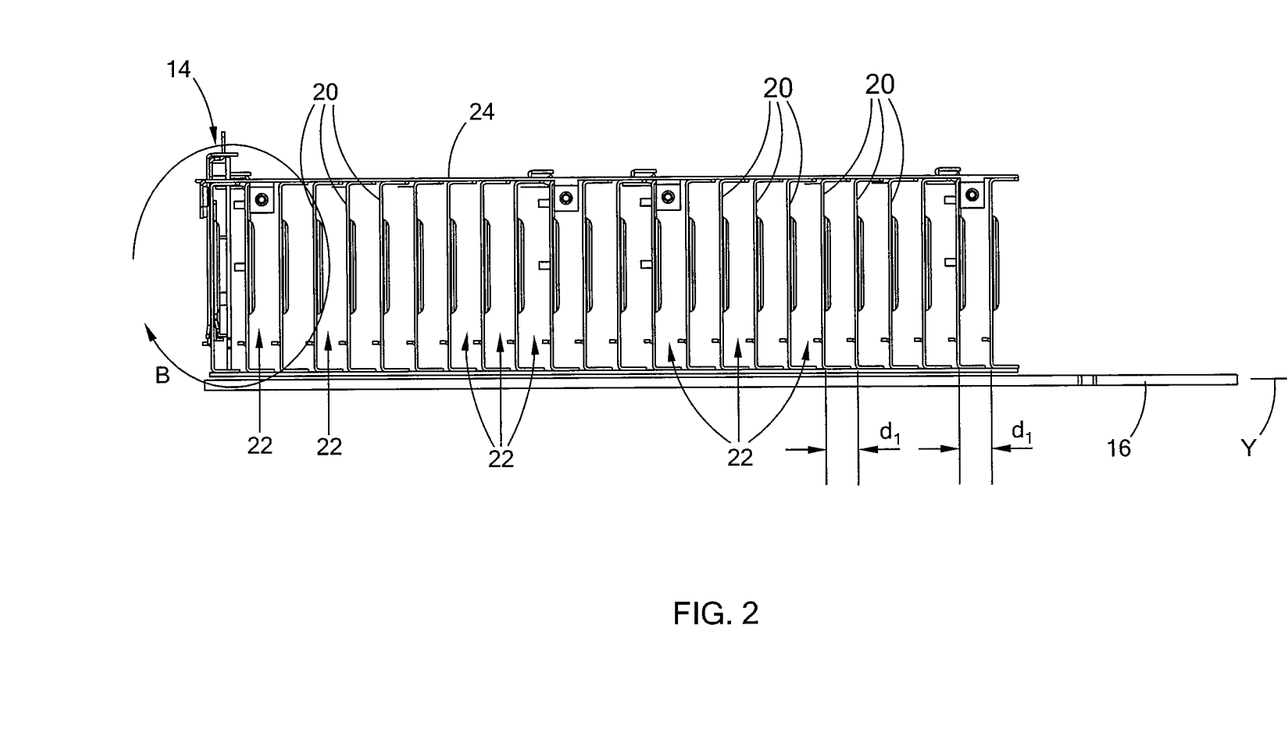
FIG. 2 is an end view of the circuit card and cage assembly constructed in accordance with the teachings of the present disclosure.

Referring to FIGS. 1 and 2, a circuit card and cage assembly constructed in accordance with the teachings of the present disclosure is generally indicated by reference number 10. The circuit card and cage assembly 10 includes a cage 12 and a plurality of circuit cards 14 removably installed in the cage 12. Only one circuit card 14 is shown for clarity. The cage 12 includes a base plate 16 and side walls 18 (shown in dashed lines) surrounding the base plate 16 to define a top-loading enclosure. A cover (not shown) may be provided to close the cage 12 after the plurality of circuit cards 14 are installed in the cage 12.

A plurality of support plates 20 extend along a longitudinal direction X of the cage 12 and are aligned in an array along a transverse direction Y perpendicular to the longitudinal direction X to define a plurality of air flow channels 22. The support plates 20 may be spaced at a first distance d1 or a second distance d2 greater than the first distance d1, depending on applications. The support plates 20 that are spaced at the second distance d2 at location A can accommodate a circuit card 14 having a larger thickness. The support plates 20 are connected by a plurality of transverse elements 24.

Figure 3:
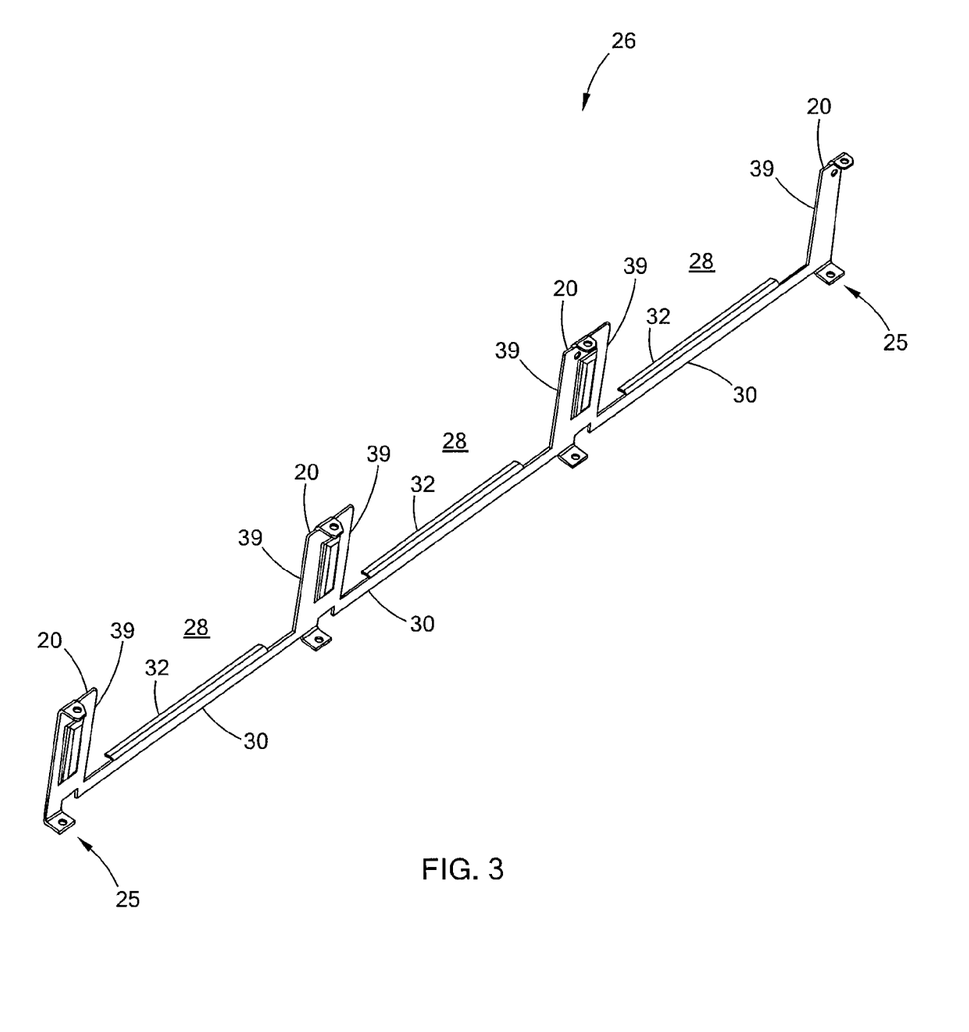
FIG. 3 is a perspective view of a first shelf member of a cage constructed in accordance with the teachings of the present disclosure.

Referring to FIG. 3, some of the support plates 20 may be integrally formed as a first shelf member 26. The support plates 20 of the first shelf member 26 are aligned and connected along the longitudinal direction X. When a plurality of first shelf members 26 are provided in the cage 12, multiple rows (e.g., four as shown in FIG. 1) of support plate arrays are provided. The support plates 20 at the longitudinal ends 25 of the first shelf member 26 may have a structure the same or different from the other support plates 20 because only one edge 39 of the support plates 20 at the longitudinal ends 25 are used for holding the circuit cards 14. The adjacent support plates 20 in the same first shelf member 26 define a card-receiving space 28 in which the circuit card 14 is received. The first shelf member 26 further includes base portions 30 that connect the support plates 20. A plurality of flanges 32 extend horizontally from the base portions 30 to define a shoulder, which provides a stop for the circuit cards 14 when the circuit cards 14 are installed to the support plates 20.

Figure 4:
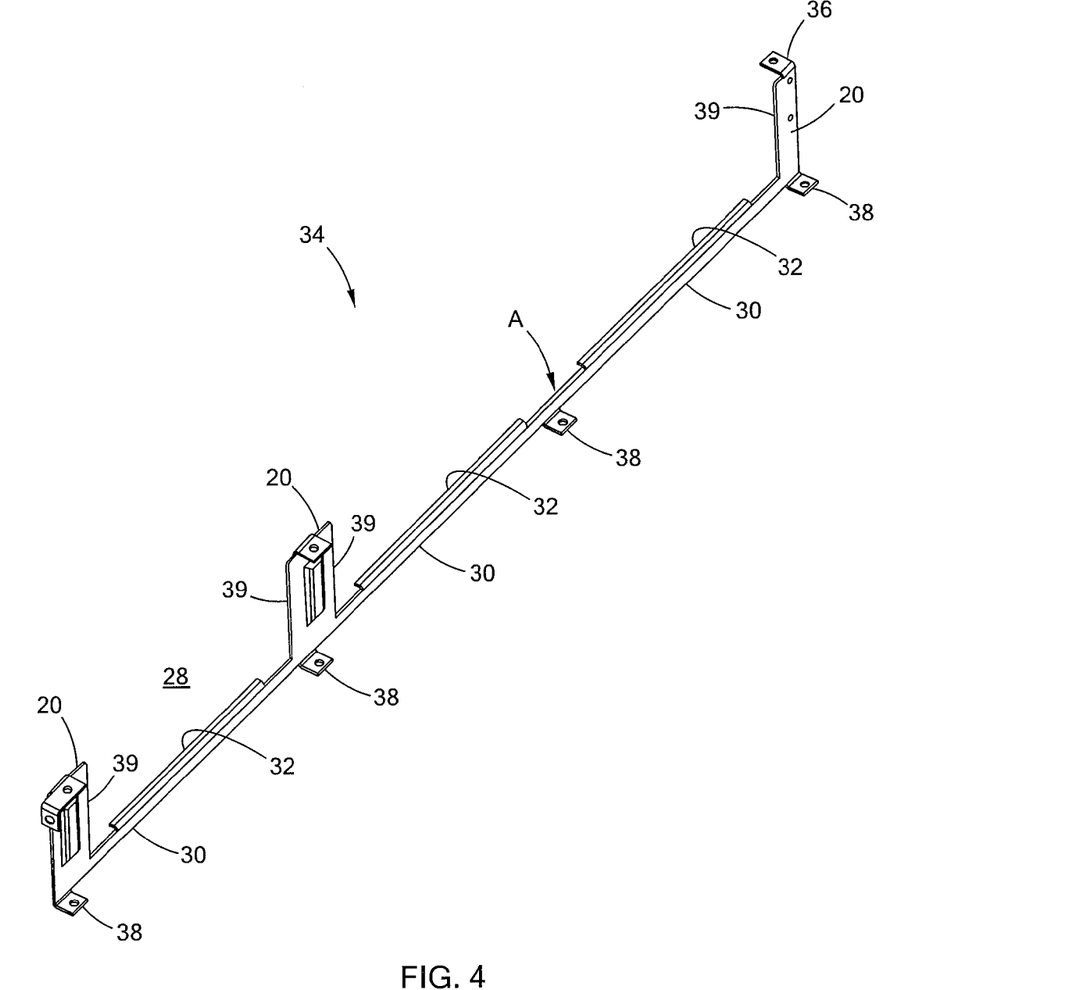
FIG. 4 is a perspective view of a second shelf member of a cage constructed in accordance with the teachings of the present disclosure.

Referring to FIG. 4, a second shelf member 34 is shown to have a structure similar to the first shelf member 26 except for the number of the support plates 20. The second shelf member 34 has three support plates 20, as opposed to four support plates 20 in FIG. 3. When the second shelf member 34 are disposed between two first shelf members 26 as shown in FIG. 1, a larger space (i.e., distance d2) is defined between the support plates 20 of the first shelf members 26 at location A. Therefore, a circuit card 14 having a larger thickness or width can be installed. Any number (including one) of support plates 20 can be used to form a shelf member 26 or 34 depending on the applications.

The support plates 20 each include an upper tab 36 and a lower tab 38 for connecting to the transverse elements 24 and the base plate 16, respectively, by using screws (not shown). Any fastening means known in the art, such as welding, bolting, riveting, for such connection can be used without departing from the scope of the present disclosure. The support plates 20 each has a substantially rectangular shape and has opposing edges 39 for engaging the circuit cards 14

Figure 5:
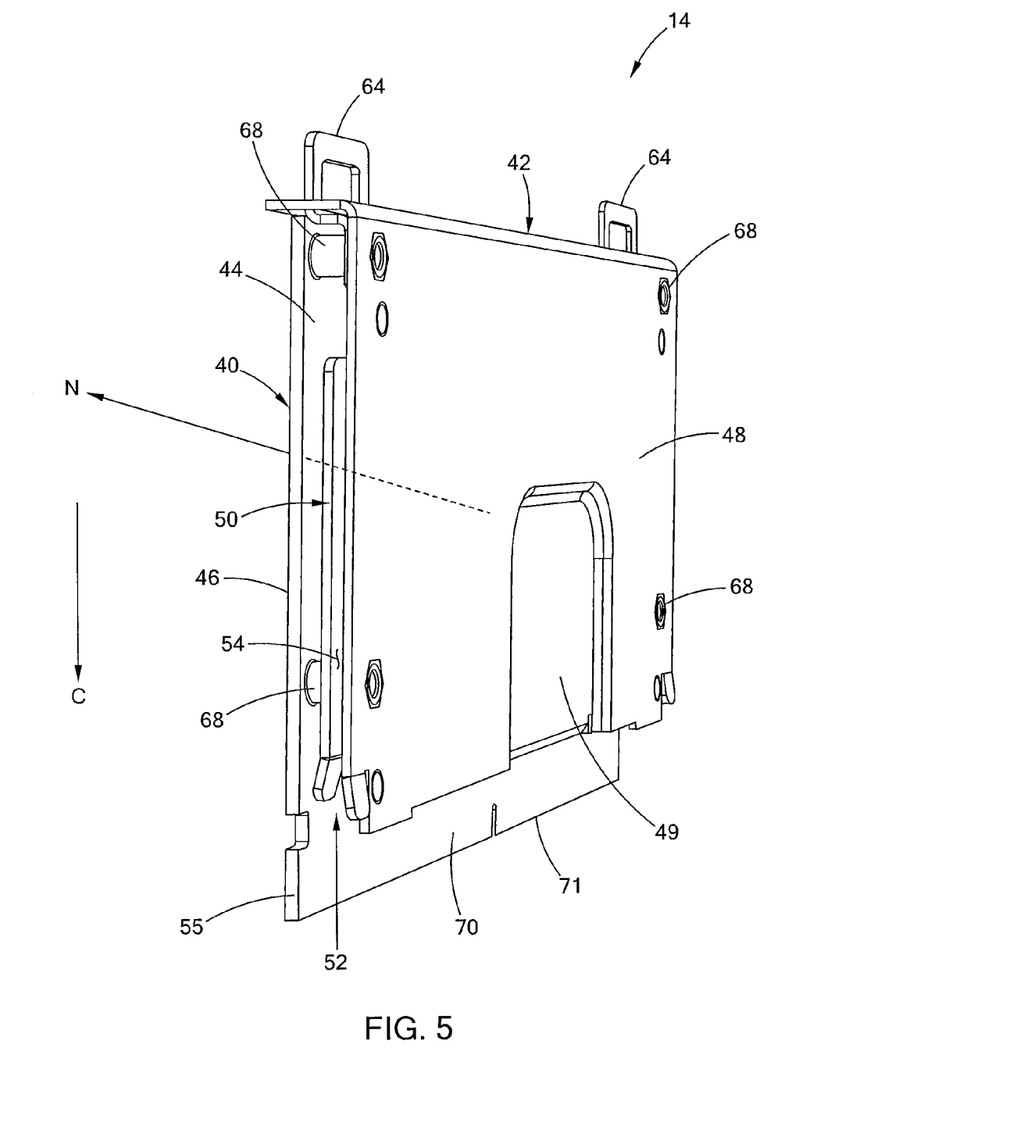
FIG. 5 is a perspective view of a circuit card constructed in accordance with the teachings of the present disclosure.
Figure 6:
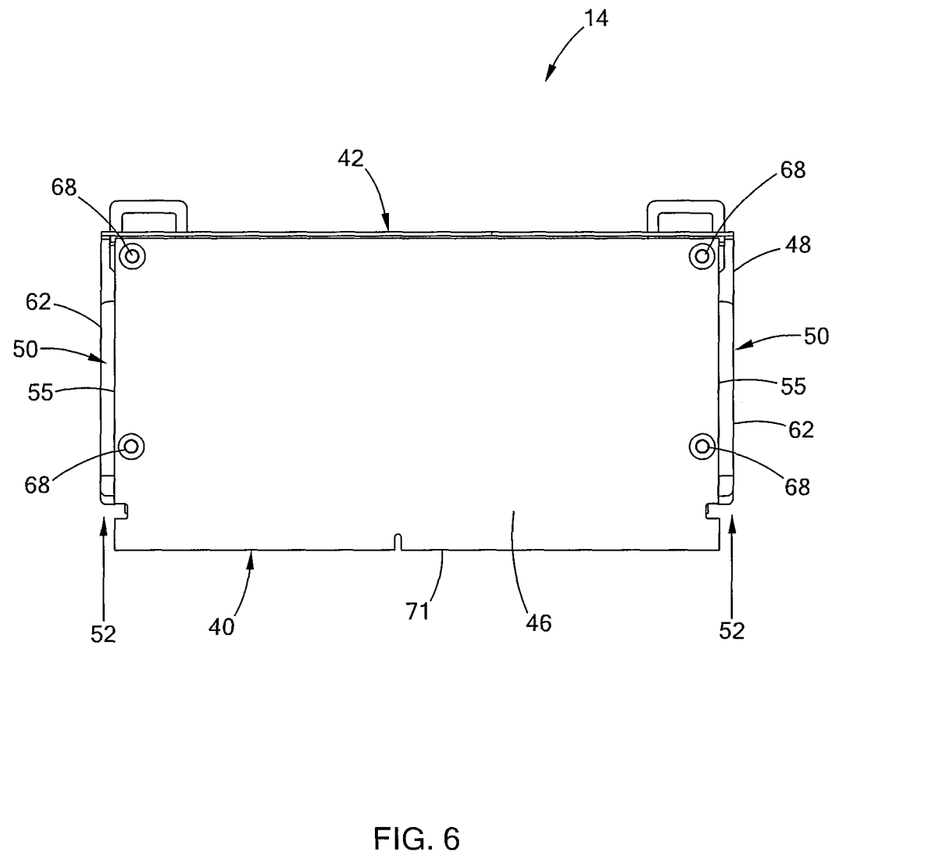
FIG. 6 is a rear view of a circuit card constructed in accordance with the teachings of the present disclosure.

Referring to FIGS. 5 and 6, the circuit card 14 includes a printed circuit board (PCB) 40 and a carrier 42. The PCB 40 has a front surface 44 on which various electronic components and circuits (not shown) are mounted, and a rear surface 46 opposing the front surface 44. The PCB 40 further includes opposing sides 55 parallel to a mounting direction. The carrier 42 includes a plate body 48 disposed adjacent to the front surface 44 of the PCB 40 and a pair of mounting structures 50 for mounting the PCB 40 to the carrier 42. The plate body 48 has a recessed portion 49 recessed toward the PCB 40 for contacting a heat-generating component (not shown) on the PCB 40.

The plate body 48 and the mounting structures 50 jointly define a pair of guiding members 52 having a slot 54. The guiding members 52 are disposed at the opposing sides 55 of the PCB 40 for guiding the support plate 20 into the slot 54 between the plate body 48 and the mounting structure 50 when the circuit card 14 is installed to the cage 12 in the mounting direction C. The guiding members 52 are offset from the PCB 40 in the normal direction N of the PCB 40. Therefore, when the circuit card 14 is installed to the support plate 20 by engaging the guiding members 52 to the support plates 20, the PCB 40 is offset from the support plates 20.

Figure 7:
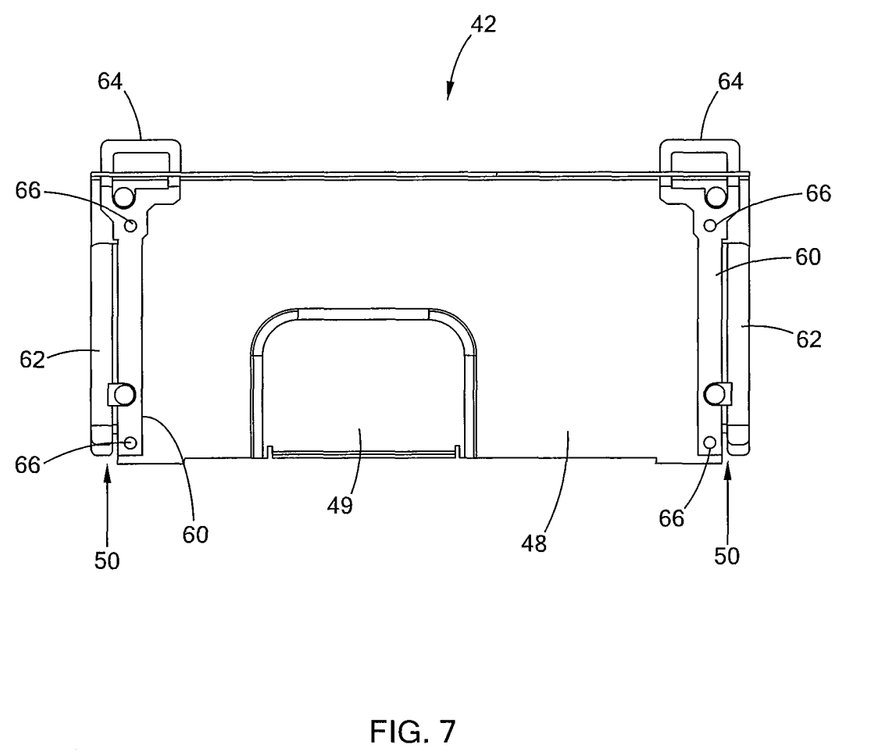
FIG. 7 is a rear view of a carrier of a circuit card constructed in accordance with the teachings of the present disclosure.
Figure 8:
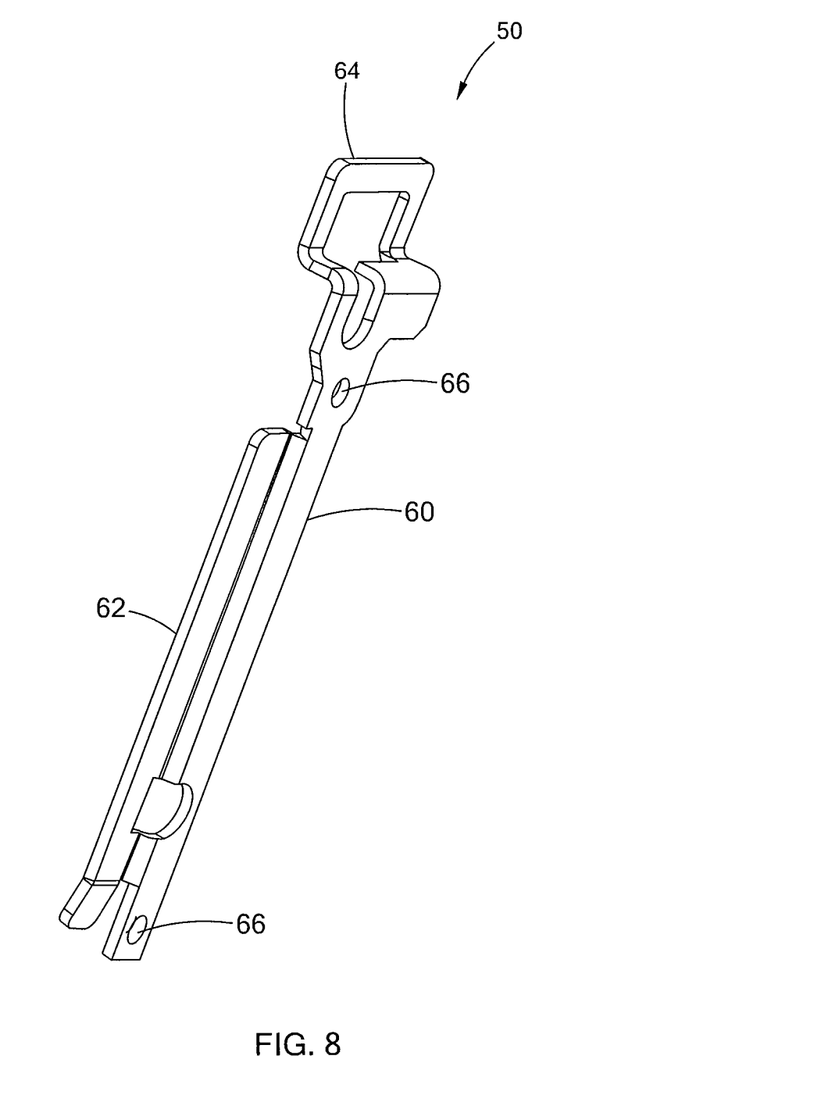
FIG. 8 is a perspective view of a mounting structure of a circuit card constructed in accordance with the teachings of the present disclosure.

Referring to FIGS. 7 and 8, the carrier 42 includes the plate body 48 and a pair of mounting structures 50 at opposing sides of the plate body 48. The mounting structures 50 each include a contact portion 60 in contact with the plate body 48, a rail portion 62 recessed from the contact portion 60 toward the PCB 40 and spaced from the plate body 48, and a pair of handles 64. The handles 64 facilitate mounting of removal of the circuit cards 14 to the support plates 20. The contact portion 62 includes holes 66 to allow screws or bolts 68 (shown in FIG. 6) to pass through to secure the PCB 40 to the plate body 48 of the carrier 42. The rail portions 62 extend along opposing sides 55 of the PCB 40 and protrude outside the PCB 40.

The plate body 48 has a length greater than the length of the PCB 40 and has a width smaller than that of the PCB 40. Therefore, the plate body 48 protrudes outside the PCBs 40 in the length direction of the PCB 40. The plate body 48 substantially covers the front surface 44 of the PCB 40 except a lower portion 70.

Figure 9:
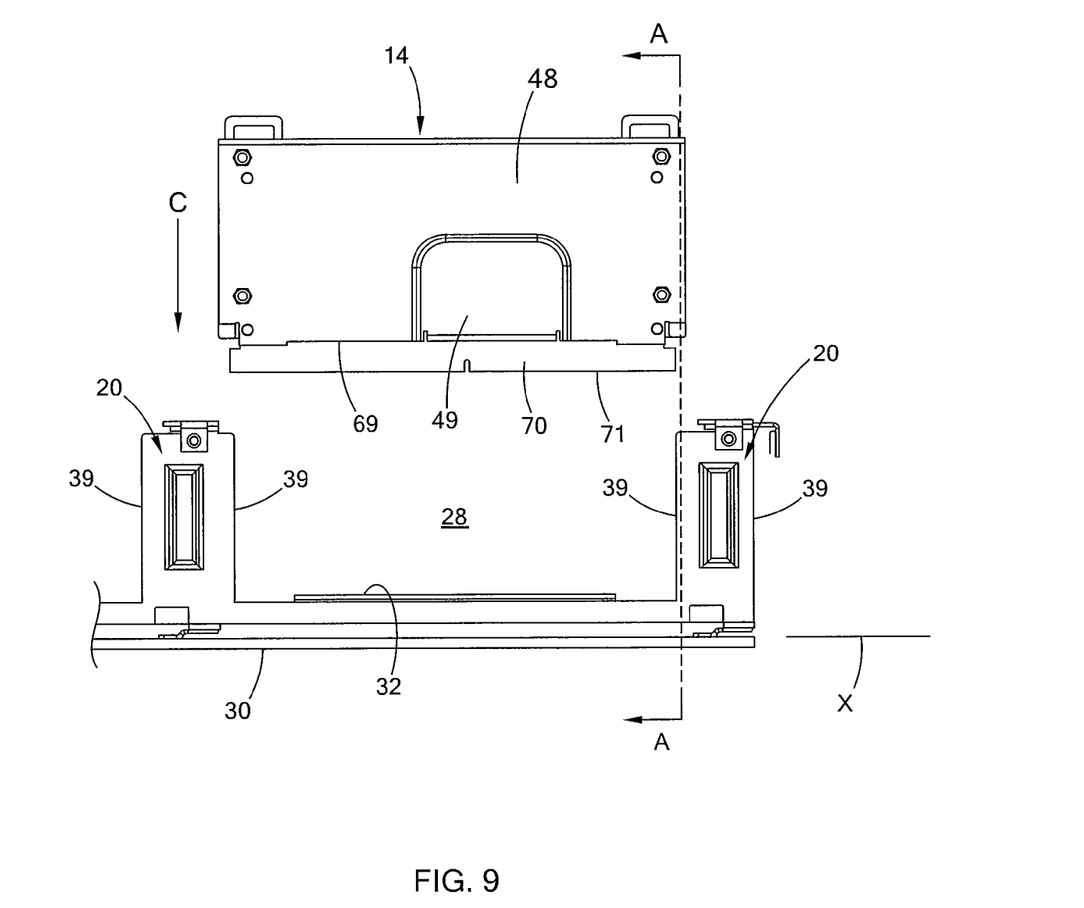
FIG. 9 is a front view of a circuit card and a shelf member, showing the circuit card is about to be installed to a shelf member.
Figure 10:
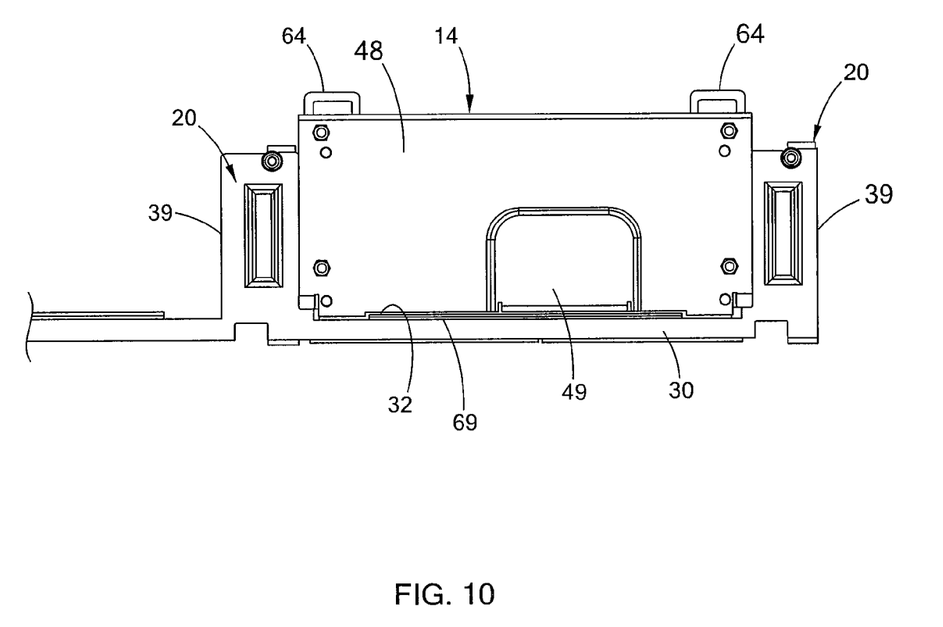
FIG. 10 is a front view of a circuit card installed to a shelf member of a cage.
Figure 11:
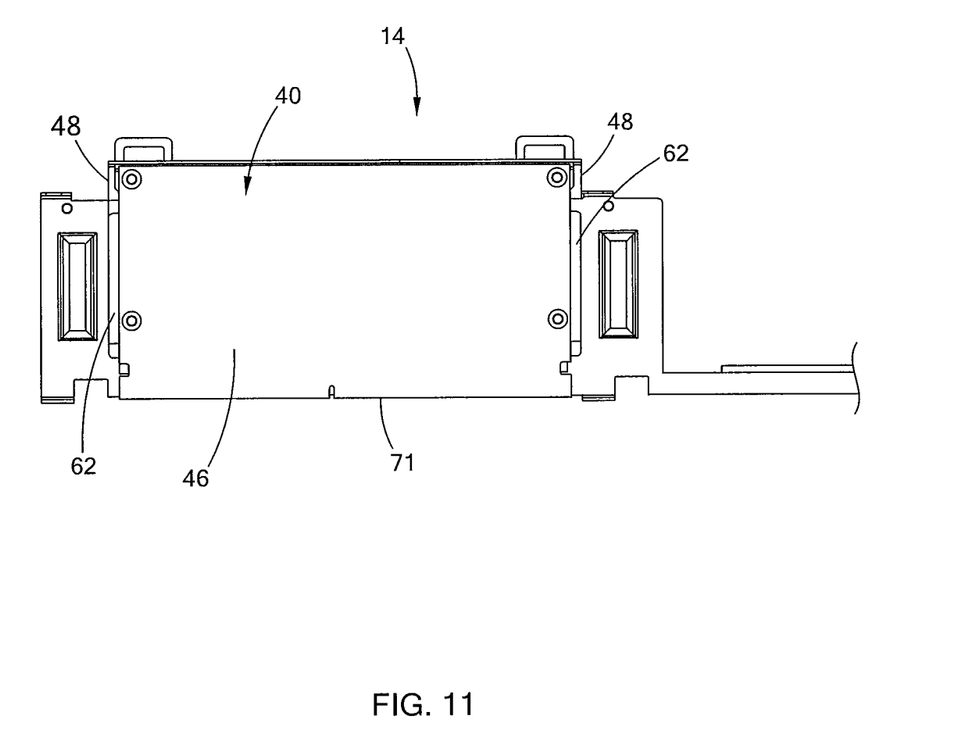
FIG. 11 is a rear view of a circuit card assembled to a shelf member of a cage.

Referring to FIGS. 9 to 11, to mount the circuit card 14 to the cage 12, the circuit card 14 is placed above the card receiving space 28 between adjacent support plates 20. The guiding members 52 of the carrier 42 are aligned with the edges 39 of the support plates 20 along the longitudinal direction X. As the circuit card 14 is moved down along the mounting direction C, the guiding members 52 guide the edges 39 of the support plate 20 into the slots 54 between the rail portion 62 and the plate body 48. The circuit card 14 is fully installed to the cage 12 when a lower edge 69 of the plate body 48 contacts the flange 32 at the base portion 30 of the shelf member 26 or 34 and a lower edge 71 of PCB 40 contacts the base plate 16 of the cage 12. As clearly shown in FIG. 11, the edges 39 of the support plates 20 are positioned between the rail portions 62 of the mounting structures 50 and the plate body 48.

Figure 12:
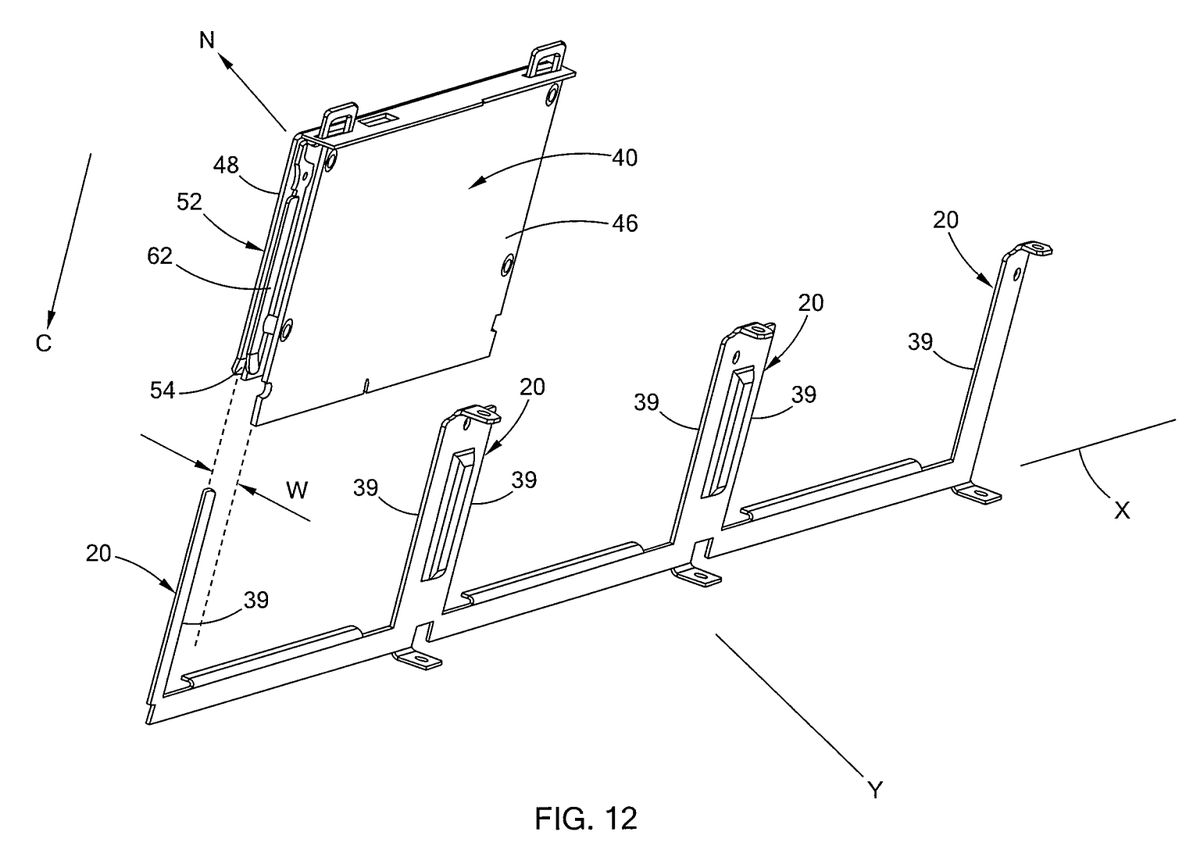
FIG. 12 is a perspective, cross-sectional view of a circuit card and a shelf member of a cage, taken along line A-A of FIG. 9.
Figure 13:
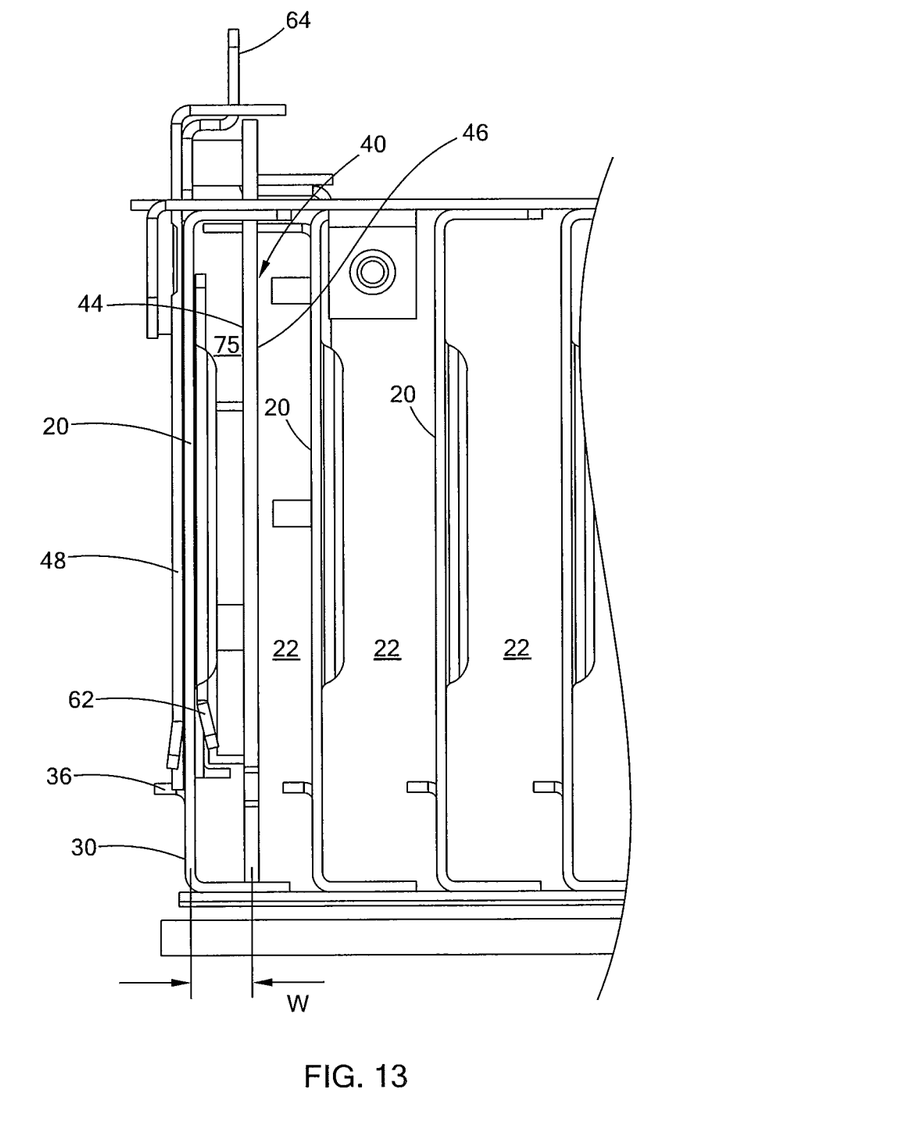
FIG. 13 is an enlarged view of portion B of FIG. 2.

Referring to FIGS. 12 and 13, the PCB 40 is disposed at a distance from the guiding members 52 that is defined by the plate body 48 and the rail portion 62 of the mounting structure 50. Therefore, when the PCB 40 is installed to the cage 12 through engagement between the guiding member 52 and the support plate 20, the PCB 40 is offset from the support plate 20 by an offset W along the transverse direction Y. The PCB 40 is located right in the air flow channel 22 and is not blocked by the support plate 20. The air flow can flow close to the rear surface 46 of the PCB 40, as opposed to a prior art cage design where the card guides normally block the air flow and direct the air flow away from the surfaces of the PCB. The cooling air can also flow through the space 75 between the front surface 44 of the PCB 40 and the plate body 48. Therefore, the circuit card and cage assembly 10 of the present disclosure provides less obstruction to air flow to improve cooling efficiency.

Moreover, the plate body 48 of the carrier 42 is made of a conductive material and substantially covers the front surface 44 of the PCB 40 with a recessed portion 49 in direct contact with a heat-generating component. The heat from the heat-generating component can be quickly conducted to the plate body 48 and spread across the plate body 48. The plate body 48 is also positioned in the air flow channel 22 and at a side of the support plate 20, which does not obstruct air flow to the surface of the plate body 48. Therefore, the heat absorbed by the plate body 48 can be efficiently dissipated to the surrounding air. The plate body 48 of the carrier 42 further improves cooling of the PCB 40.

Figure 14:
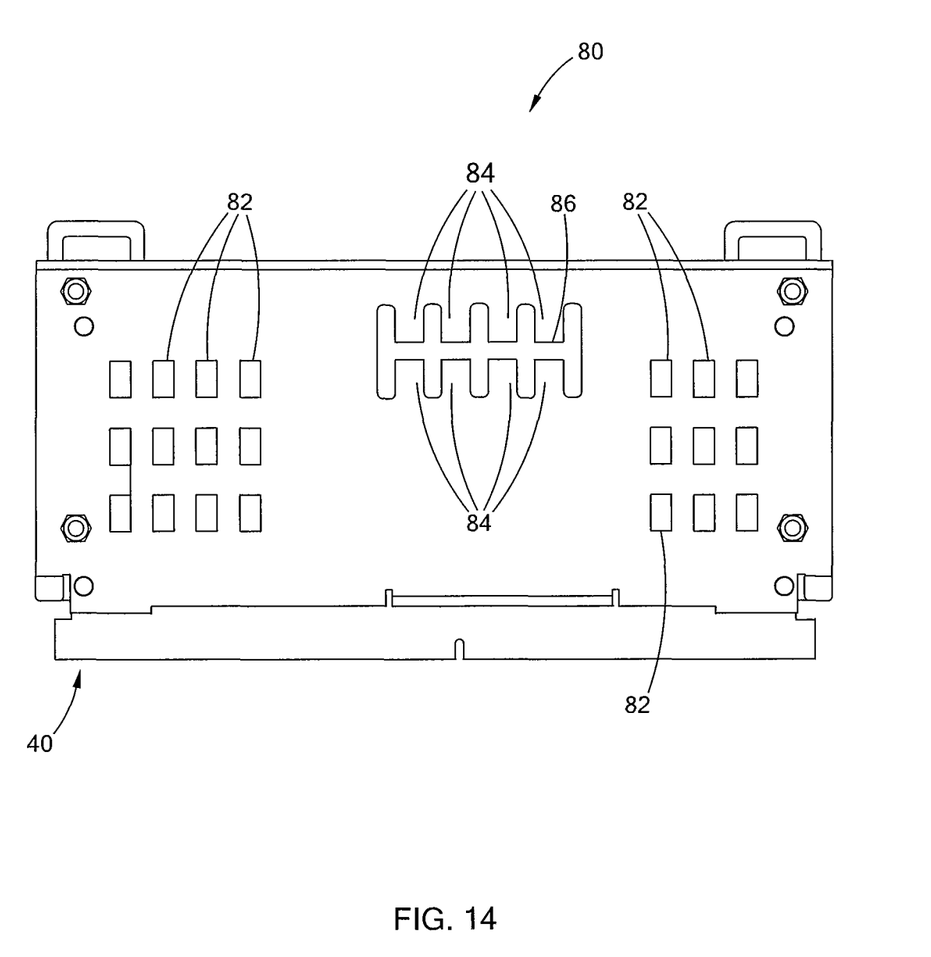
FIG. 14 is a front view of a variant of a circuit card constructed in accordance with the teachings of the present disclosure.

Referring to FIG. 14, a variant of a circuit card 80 is shown to have a structure similar to that of the circuit card 14 except for the structure of the plate body 82. The plate body 82 defines a plurality of openings 82 that may help improve air circulation inside and outside the circuit card 80. The plate body 82 has a plurality of stamped tabs 84 that are recessed toward the PCB 40 for contacting a heat-generating component 86. The heat-generating component 86 is exposed due to the opening defined by the plurality of stamped tabs 84. It is understood that the shape, number, size, and location of the openings, and the shape and size of the recessed portions for contacting the heat-generating component are not limited to those shown in the drawings and can be easily modified to suit a particular application.

Figure 15:
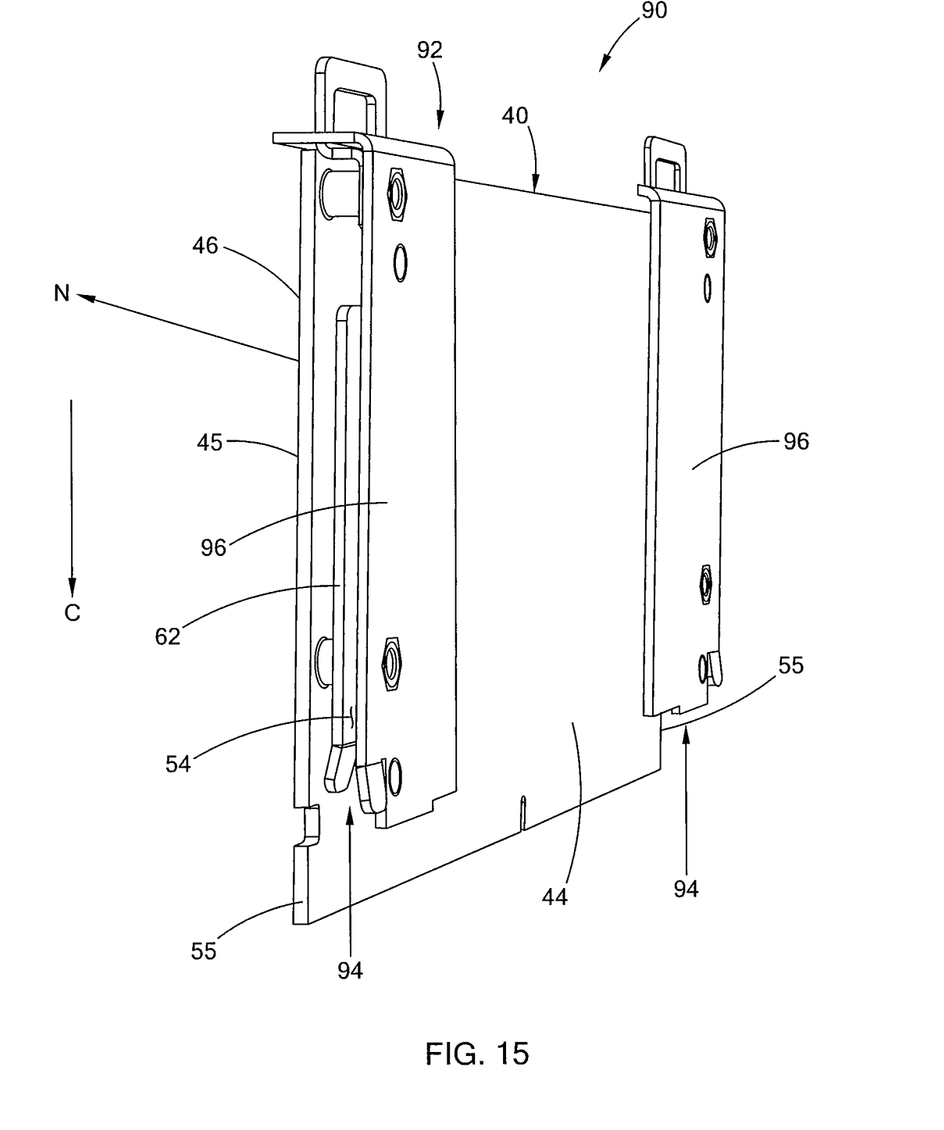
FIG. 15 is a perspective view of another variant of a circuit card constructed in accordance with the teachings of the present disclosure.

Referring to FIG. 15, another variant of a circuit card 90 is shown to have a structure similar to the circuit card 14 except for the structure of the carrier 92. Similarly, the carrier 92 includes a pair of guiding members 94 disposed at the opposing sides 55 of the PCB 40 and defining a pair of slots 54. The carrier 92, however, does not have a plate body that substantially covers the front surface 44 of the PCB 40. Instead, the carrier 92 includes a pair of plate bodies 96 that are much narrower than the plate body 48 such that the front surface 44 of the PCB 40 is substantially exposed. The pair of plate bodies 96 are disposed opposing the rail portions 62 of the mounting structures 50 to define the guiding members 94. The slots 54 are formed between the rail portions 62 and the plate bodies 96.

It is understood that only one guiding member may be provided at one of the opposing sides 55 of the PCB 40 to provide proper guiding, positioning, and installation of the PCB 40 to the support plate 20 without departing from the scope of the present disclosure.

In the circuit card and cage assembly 10 of the present disclosure, the circuit card 14 includes a carrier 42 for mounting the circuit card 14 to the support plate 20 of the cage 12. The support plate 20 is inserted in the slots 54 of the carrier 42 and thus can be made thinner to increase the width of the air flow channel 22, as opposed to a prior art card guide that must be made wider than the thickness of the printed circuit board to receive the printed circuit board. The support plates 20 with a reduced thickness not only widen the air flow channel 22 but also allow the support plates 20 to be more closely arranged to allow the circuit cards 14 to be more closely packed.

Moreover, the carrier 42 allows the PCB 40 to be positioned away from the support plate 20 and right in the air flow channel 22 such that air can flow close to the surfaces of the PCB 40 to improve cooling.

Further, the carrier 42, which has a plate body 48 substantially covering the PCB 40 in one embodiment, functions as a heat sink/heat spreader to help remove heat from the PCB 40 to further improve cooling of the PCB 40. The carrier 42, which is made of a conductive material and has handles 64 to facilitate handling of the carrier 42, also provides electrostatic discharge protection for the PCB 40.

Electrostatic discharge may occur at a prior art PCB when a user's hand holds the prior art PCB and/or when the PCB is inserted into the slot of a metal card guide in a prior art cage. The electric potential differences between the user's hand and the PCB and between the PCB and the metal card guide cause electrostatic discharge to randomly occur at the PCB, making the circuitry on the prior art PCB susceptible to electrostatic damage. Further, in a rare case, the typical PCB may cause a static build-up in the PCB due to sliding of the prior art insulative PCB in the slot of the card guide.

In contrast, the PCB 40 of the circuit card 14 of the present disclosure is protected against electrostatic damage by providing the carrier 42 or 92, whether it covers the entire surface or only a portion of the PCB 40. When a user holds the circuit card 14 and install the circuit card 14 in the cage 12, the carrier 42 or 92 is in direct contact with a user's hand and the support plate 20 in the cage 12. The electrostatic discharge is controlled to occur at the carrier 42 or 92, rather than the PCB 40. Moreover, the carrier 42 or 92 also provides a safe discharge for any other potential currents, in case of a power supply failure. Further, the circuit card 14 is installed in the cage 12 by sliding the metal carrier 42 or 92 along the metal support plate 20. No static build-up would occur between the carrier 42 or 92 and the support plate 20. Therefore, the carrier 42 or 92 has the advantages of guiding installation of the circuit card 14 in the cage 12, dissipating heat from the PCB 40, and protecting the PCB 40 against electrostatic damage.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A circuit card comprising:
   a printed circuit board (PCB) having a PCB surface, a normal direction defined normal to the PCB surface, and including opposing sides parallel to a mounting direction when the PCB is installed to a cage; and
   a carrier attached to the PCB and including at least one guiding member offset from the PCB in the normal direction, the guiding member defining a slot for guiding a support plate of a cage into the slot so as to mount the PCB to the support plate, the slot being parallel to and open in the mounting direction.

2. The circuit card of claim 1, wherein the carrier includes a plate body and a mounting structure disposed between the plate body and the PCB, the mounting structure connecting the PCB to the plate body.

3. The circuit card of claim 2, wherein the slot is defined between the plate body and the mounting structure.

4. The circuit card of claim 2, wherein the plate body and the mounting structure define the at least one guiding member.

5. The circuit card of claim 2, wherein the mounting structure includes a contact portion in contact with the plate body and a rail portion spaced from the plate body.

6. The circuit card of claim 5, wherein the slot is defined between the rail portion and the plate body.

7. The circuit card of claim 6, wherein the guiding member is defined by the rail portion and the plate body.

8. The circuit card of claim 1, further comprising a pair of guiding members disposed along the opposing sides of the PCB, the carrier including a plate body extending between the opposing sides of the PCB, the plate body defining a part of the guiding members.

9. The circuit card of claim 1, wherein the carrier is disposed adjacent to a front surface of the PCB on which at least one electronic component is mounted.

10. The circuit card of claim 9, wherein the carrier has a recessed portion recessed toward the front surface of the PCB to contact the at least one electronic component.

11. A circuit card comprising:
a printed circuit board (PCB) having opposing sides parallel to a mounting direction when the PCB is installed to a cage;
a plate body disposed adjacent to a surface of the PCB to cover a portion of the PCB;
a pair of mounting structures disposed between the PCB and the plate body for connecting the PCB to the plate body, the mounting structures each include a rail portion spaced from the plate body and parallel to the plate body and the mounting direction to define a slot between the rail portion and the plate body, the slot being parallel to and open in the mounting direction and offset from the PCB for guiding a support plate of a cage into the slot so as to mount the PCB to the support plate.

12. A circuit card and cage assembly, comprising:
a cage including a plurality of support plates extending along a first direction of the cage, the plurality of support plates being aligned along a second direction of the cage to define a plurality of air flow channels between the plurality of support plates, the second direction being perpendicular to the first direction; and
a plurality of circuit cards, each including a printed circuit board (PCB) and a carrier attached to the PCB, the carrier being offset from the PCB along a direction normal to the PCB and defining a slot parallel to and open in the mounting direction,
wherein the plurality of circuit cards are mounted to the support plates by inserting the support plates to corresponding ones of the slots and the PCBs are offset from the support plates along the second direction.

13. The circuit card and cage assembly of claim 12, wherein the carriers each include at least one guiding member for guiding installation of the circuit cards to the support plates.

14. The circuit card and cage assembly of claim 13, wherein the at least one guiding member is provided at one of the opposing sides of the PCB that are parallel to the mounting direction.

15. The circuit card and cage assembly of claim 12, wherein at least two of the support plates are aligned along the first direction to define a card receiving space therebetween.

16. The circuit card and cage assembly of claim 12, wherein the carriers are disposed adjacent to a front surface of the PCB on which at least one electronic component is disposed.

17. The circuit card and cage assembly of claim 12, wherein the carriers each include a recessed portion recessed toward the PCB and contacting at least one heat-generating component on the PCB.

18. The circuit card and cage assembly of claim 12, wherein the carriers each include a plate body and a mounting structure between the plate body and the PCB.

* * * * *